(12) United States Patent
Liu et al.

(10) Patent No.: US 7,200,031 B2
(45) Date of Patent: Apr. 3, 2007

(54) PROTON AND HEAVY ION SEU RESISTANT SRAM

(75) Inventors: Michael Liu, Bloomington, MN (US); Harry Liu, Plymouth, MN (US)

(73) Assignee: Honeywell International, Inc., Morristown, NJ (US)

( * ) Notice: Subject to any disclaimer, the term of this patent is extended or adjusted under 35 U.S.C. 154(b) by 90 days.

(21) Appl. No.: 11/082,161

(22) Filed: Mar. 16, 2005

(65) Prior Publication Data

US 2006/0209588 A1 Sep. 21, 2006

(51) Int. Cl.
G11C 11/00 (2006.01)

(52) U.S. Cl. .................... 365/154; 365/156; 365/190; 365/1

(58) Field of Classification Search .............. 365/154, 365/49, 156, 175, 189.08, 190
See application file for complete search history.

(56) References Cited

U.S. PATENT DOCUMENTS

| | | | |
|---|---|---|---|
| 4,725,981 A | 2/1988 | Rutledge | 365/154 |
| 5,631,863 A | 5/1997 | Fechner et al. | 365/156 |
| 6,058,041 A * | 5/2000 | Golke et al. | 365/156 |
| 6,180,984 B1 * | 1/2001 | Golke et al. | 257/347 |
| 6,215,694 B1 * | 4/2001 | Li et al. | 365/156 |
| 6,510,076 B1 * | 1/2003 | Lapadat et al. | 365/154 |
| 6,735,110 B1 | 5/2004 | Lesea | 365/154 |
| 6,756,692 B2 | 6/2004 | Hirano et al. | 257/903 |
| 6,775,178 B2 * | 8/2004 | Liu et al. | 365/154 |
| 6,807,081 B2 * | 10/2004 | Nii | 365/145 |
| 6,822,894 B1 * | 11/2004 | Costello et al. | 365/154 |
| 6,873,565 B1 * | 3/2005 | Riedlinger et al. | 365/230.05 |
| 6,975,041 B2 * | 12/2005 | Hirano et al. | 257/393 |
| 2004/0179410 A1 | 9/2004 | Hirano et al. | 365/199 |
| 2006/0176727 A1 * | 8/2006 | Liu | 365/154 |

FOREIGN PATENT DOCUMENTS

WO    WO 00/41181 A    7/2000

OTHER PUBLICATIONS

Liu et al., "proton Induced Single Event Upset in a 4M SOI SRAM," 2003 IEEE International SOI Conference Proceedings. Newport Beach, CA, Sep. 29-Oct. 2, 2003, IEEE International SOI Conference, New York, NY: IEEE, US, Sep. 29, 2003, p. 26-27, XP010665919.

(Continued)

*Primary Examiner*—Richard Elms
*Assistant Examiner*—Hien N Nguyen
(74) *Attorney, Agent, or Firm*—McDonnell Boehnen Hulbert & Berghoff LLP

(57) ABSTRACT

A method and system is disclosed for reducing proton and heavy ion SEU sensitivity of a static random access memory (SRAM) cell. A first passive delay element has been inserted in series with an active delay element in a first feedback path of the SRAM cell, and a second passive delay element has been inserted in a second feedback path of the SRAM cell. The passive delay elements reduce the proton SEU sensitivity of the SRAM cell, and the active delay element reduces the heavy ion sensitivity of the SRAM cell. The passive delay elements also protect the SRAM cell against SEUs that may occur when the SRAM cell is in dynamic mode.

13 Claims, 9 Drawing Sheets

OTHER PUBLICATIONS

Hauser J. R. "SEU-Hardened Silicon Bipolar and GAAS Mesfet SRAM Cells Using Local Redundancy Techniques," IEEE Transactions on Nuclear Science, IEEE Service Center, New York, NY, US vol. 39, No. 1, Feb. 1, 1992, p. 2-6.

International Search Report for PCT/US2005/044334, dated Jun. 2, 2006.

S.E. Diehl, et al., "Error Analysis and Prevention of Cosmic Ion-Induced Soft Errors in Static CMOS RAMS", IEEE Transactions on Nuclear Science, vol. NS-29, No. 6, Dec. 1982.

H. Liu et al., "Proton Induced Single Event Upset In A 4M SOI SRAM", 2003 IEEE Int. SOI Conference Proceedings, 26 (2003).

S.T. Liu, et al., "Single Event Effects in PDSOI 4 M SRAM Fabricated in UNIBOND", IEEE Trans. Nucl. Sci. 50(6), 2095 (Dec. 2003).

S.T. Liu, et al., "Proton Induced Upset in SOI CMOS SRAMS", IEEE Trans, Nucl. Sci. 51(6), 3475 (Dec. 2004).

* cited by examiner

PROTON AND HEAVY ION SEU RESISTANT SRAM

GOVERNMENT RIGHTS

The United States Government has acquired certain rights to this invention pursuant to Contact No. N00173-01-C-2017 with the Navy.

FIELD

The present invention relates generally to semiconductor storage devices, and more specifically, relates to SRAM memory cells.

BACKGROUND

A memory, such as a static random access memory (SRAM), typically comprises a plurality of memory cells each of which stores a bit of information. A memory cell 100 that is typically used in an SRAM is shown in FIG. 1. The memory cell 100 is a six transistor cell and includes a first inverter 102 and a second inverter 104. The first inverter 102 includes MOSFETs 106 and 108, and the second inverter 104 includes MOSFETs 110 and 112.

The source terminals of the MOSFETs 106 and 110 are coupled to a source VSS, and the source terminals of the MOSFETs 108 and 112 are coupled to a supply VDD. The first and second inverters 102 and 104 are cross coupled. Accordingly, the gate terminals of the MOSFETs 106 and 108 are connected to the drain terminals of the MOSFETs 110 and 112, and the gate terminals of the MOSFETs 110 and 112 are connected to the drain terminals of the MOSFETs 106 and 108.

A first transmission gate 114, also known as a pass gate, includes a MOSFET having a first source/drain contact coupled to the drain terminals of the MOSFETs 106 and 108, a second source/drain contact coupled to a bit line BL, and a gate terminal coupled to a word line WL. Also, a second transmission gate 116, or pass gate, includes a MOSFET having a first source/drain contact coupled to the drain terminals of the MOSFETs 110 and 112, a second source/drain contact coupled to an inverted bit line NBL, and a gate terminal coupled to the word line WL.

Each memory cell within the memory may be vulnerable to high-energy particles from a radiation harsh environment. These high-energy particles may cause a Single Upset Event (SEU) in a memory cell, which is a change in the stored state of the memory cell. The SEU may occur when a high-energy particle deposits a charge on a given node within the memory cell. The charge threshold at which the SEU may occur is called the critical charge of the memory cell.

Heavy ions are typically considered the dominating cause for SEUs. Heavy ions may be capable of depositing relatively large amounts of charge on a memory cell node. The large deposited charge may force the memory cell node from its original state to an opposite state for some period of time. If the memory cell node is held in the opposite state for a period longer than the delay around the memory cell feedback loop, the memory cell will switch states and the data will be lost.

In addition, protons and neutrons may also cause SEUs. Protons and neutrons typically do not deposit enough charge on a memory cell node to cause an SEU, but protons or neutrons may interact with a Si nuclei of the SRAM. The interaction between the protons or neutrons and the Si nuclei may create secondary high-energy particles, which are also known as recoiling heavy ions. The recoiling heavy ions may be able to travel through a Si lattice and reach the memory cell node. If the recoiling heavy ion does reach the memory cell node, the recoiling heavy ion may cause a SEU under certain conditions.

In one example, a SEU may occur in the memory cell 100 of FIG. 1 when the memory cell 100 is storing a "1" in standby mode. In this example, both the bit line BL and the inverted bit line NBL are held to "1," the word line is held to "0," and each of the MOSFETs 106, 112 and 116 are in an off-condition. Thus, if a heavy ion or recoiling heaving ion deposits a charge on any of the MOSFETs 106, 112 or 116 that exceeds the critical charge for that memory cell node, an SEU may occur. In another example, a SEU may occur in the memory cell 100 of FIG. 1 when the memory cell 100 is storing a "0" in standby mode. In this example, both the bit line BL and the inverted bit line NBL are held to "0," the word line is held to "0," and each of the MOSFETs 108, 110 and 114 are in an off-condition. Thus, if a heavy ion or recoiling heaving ion deposits a charge on any of the MOSFETs 108, 110 or 114 that exceeds the critical charge for that memory cell node, an SEU may occur.

Many solutions for reducing the sensitivity of SRAM cells to SEUs caused by heavy ions and protons have been proposed previously. One proposed solution to make an SRAM cell more SEU hardened is to add cross-coupled polysilicon resistors to the memory cell 100 in FIG. 1. A memory cell 200 with two cross-coupled polysilicon resistors is depicted in FIG. 2. The memory cell 200 is substantially the same as the memory cell 100 in FIG. 1, except that first and second inverters 202 and 204 are cross coupled through polysilicon resistors 218 and 220. Accordingly, the drain terminals of MOSFETs 206 and 208 are coupled to the gate terminals of MOSFETs 210 and 212 through the polysilicon resistor 218, and the drain terminals of MOSFETs 210 and 212 are coupled to the gate terminals of MOSFETs 206 and 208 through the polysilicon resistor 220.

The polysilicon resistors 218 and 220, which are also known as feedback resistors, are beneficial because the polysilicon resistors 218 and 220 may add delay to the feedback path through the inverters 202 and 204. The increased feedback delay may give a data state holding transistor of the inverters 202 and 204 time to remove a charge deposited by a heavy ion strike before the feedback is completed. If the data state holding transistor removes the deposited charge before the feedback is complete, the SEU may be avoided. Thus, the addition of cross-coupled polysilicon resistors 218 and 220 may improve both the critical charge and the SEU hardness of the memory cell 200.

However, there may also be disadvantages to the addition of cross-coupled polysilicon resistors 218 and 220. One disadvantage is that the polysilicon resistors 218 and 220 may increase the write time of the memory cell 200, because the increased delay in the feedback loop is also present during a write operation. Another disadvantage is that the resistance of the polysilicon resistors 218 and 220 may change exponentially with temperature. Hence, at high temperatures, the resistivity of the polysilicon resistors 218 and 220 may be at a minimum and the memory cell 200 may be more sensitive to SEUs.

Another proposed solution to make an SRAM cell more SEU hardened is to add a capacitor to the memory cell 100 in FIG. 1. A memory cell 300 with an added capacitor is depicted in FIG. 3. The memory cell 300 is substantially the same as the memory cell 100 in FIG. 1, except that capacitor 318 is connected between the output of the first inverter 302 and the output of the second inverter 304. Accordingly, capacitor 318 is connected between the drain terminals of MOSFETs 306 and 308 and the drain terminals of MOSFETs 310 and 312.

The addition of capacitor 318 may be beneficial because the capacitor 318, which is enhanced by the Miller effect, may add delay to the feedback path through the inverters 302 and 304. As stated previously, the increased delay may improve the critical charge and SEU hardness of the memory cell 300. However, the disadvantage of adding the capacitor 318 to the memory cell 300 is that the area required to implement the necessary capacitance may be too large for the memory cell 300.

Yet another proposed solution to make an SRAM cell more SEU hardened is to add two cross-coupled active delay elements. A memory cell 400 with two cross-coupled active delay elements is depicted in FIG. 4. The memory cell 400 is substantially the same as the memory cell 100 in FIG. 1, except that first and second inverters 402 and 404 are cross coupled through active delay elements 418 and 420. Accordingly, the drain terminals of MOSFETs 406 and 408 are coupled to the gate terminals of MOSFETs 410 and 412 through the active delay element 418, and the drain terminals of MOSFETs 410 and 412 are coupled to the gate terminals of a MOSFETs 406 and 408 through the active delay element 420.

The active delay elements 418 and 420 typically include a switched resistor, consisting of a switch and a shunted resistor which can be passive or active. The switch may take various forms. For example, the switch may be a single enhancement-mode NMOS transistor, or the switch may be a single depletion-mode PMOS transistor. If the switch is a MOSFET switch, the gate of the MOSFET switch may be coupled to a word line WL.

The active delay elements 418 and 420 are beneficial because, similar to other proposed solutions, the active delay elements 418 and 420 may improve the critical charge and SEU hardness of the memory cell 400 by adding delay to the feedback path through the inverters 402 and 404 during standby mode of operation. In fact, the memory cell 400 was shown to be heavy ion and proton SEU hard for a 0.8 µm 256K SOI CMOS SRAM. Further, active delay elements 418 and 420 may not substantially increase the write time of the memory cell 400 during a write operation, because the switch in each of the active delay elements 418 and 420 may be shorted when the word line WL is high. In addition, active delay elements 418 and 420 may not be nearly as large as capacitors 318 and 320.

However, there may also be disadvantages to the addition of delay elements 418 and 420 to the memory cell 400. One disadvantage is that the memory cell 400 may be sensitive to SEUs during a dynamic mode (i.e. read or write mode) when the word line WL is high, because the active delay elements 418 and 420 are shorted. Another disadvantage is that delay elements 418 and 420 require additional silicon area and may exceed the size restrictions of larger capacity SRAMs.

In light of the size restrictions of larger capacity SRAMs, solutions were then proposed to make a smaller SEU hardened SRAM memory cell. One proposed solution was to eliminate one of the two active delay elements in memory cell 400. A memory cell 500 with only one active delay element is depicted in FIG. 5. The memory cell 500 is substantially the same as the memory cell 400 in FIG. 4, except that active delay element 420 has been eliminated.

The memory cell 500 is beneficial because it occupies a smaller size and may be implemented in larger capacity SRAMs. However, the memory cell 500 may still be sensitive to SEUs during dynamic mode. Further, the heavy ion performance of memory cell 500 may suffer. For example, if the active delay element 518 includes a single enhancement-mode NMOS transistor coupled in parallel with two polysilicon or Schottky resistors, the heavy ion performance may suffer because of the parasitic bipolar effect associated with the NMOS transistor.

FIG. 6 depicts the heavy ion performance of a 4M SRAM comprising memory cells 500 with the active delay element 518 mentioned above. The graph in FIG. 6 displays heavy ion upset cross-section as a function of linear energy transfer (LET). Heavy ion particles with a range of effective LETs were interacted with the 4M SRAM, and the upset cross-section of the 4M SRAM for each effective LET was then measured. A Weibull fit was then drawn through these data points. The gate area of an off-NMOS transistor in memory cells 500 is also represented on the graph as dashed line "A." As shown in the graph, the limiting upset cross-section of the 4M SRAM comprising memory cells 500 is larger than the gate area of the off-NMOS transistor, indicating that the sensitive area may be extended into the drain and/or body tie region of the transistor and cause an SEU. Further, as show in the graph, the onset LET of the 4M SRAM is low, indicating that the 4M SRAM may be sensitive to protons.

Recently, improvements to memory cell 500 have been proposed that may reduce the heavy-ion upset cross-section. One proposed improvement is a new switch transistor in the active delay element 518 that includes two MOSFETs connected in series. Another proposed improvement is the reduction of the lateral bipolar gain of each transistor in the memory cell 500, and specifically the switch transistor of the active delay element 518. The bipolar gain may be reduced by reducing the recombination lifetime of the memory cell 500 through argon ion implantation. Yet another proposed improvement is the optimization of resistor values in the active delay element 518. The implementation of these improvements may improve the heavy ion performance of memory cell 500.

FIG. 7 depicts the heavy ion performance of a 4M SRAM comprising the improved memory cells 500. As shown in the figure, the improvements to memory cell 500 may reduce the limiting offset cross-section of the 4M SRAM by nearly 100 times, which is a factor of 30 times lower than the gate area of an off-NMOS transistor in memory cells 500. However, as shown in the graph, there may be very little improvement in the onset LET of the 4M SRAM, indicating that the 4M SRAM comprising improved memory cells 500 may still be sensitive to protons. For example, a proton induced SEU may occur when the memory cell 500 is in standby mode if a recoiling heavy ion (created by a proton-silicon nuclear reaction as described above) hits the switch of the active delay element 518 and any one of the off-condition MOSFETs of the memory cell 500 in one straight pass. This type of SEU may be referred to as a double-node hit.

Accordingly, there is a need for a scalable SRAM cell that is SEU hardened for both heavy ions and protons, regardless of the operating mode (static or dynamic).

SUMMARY

A static random access memory (SRAM) cell is described. The SRAM cell may include a first inverter having an input and an output, a second inverter having an input and an output, an active delay element, a first passive delay element, a first transmission gate coupled to the output of the first inverter, a second transmission gate coupled to the output of the second inverter, a non-inverted bit line coupled to the first transmission gate, an inverted bit line coupled to the second transmission gate, and a non-inverted word line coupled to the first and second transmission gates and to the active delay element. The SRAM cell may also include a second passive delay element.

In the preferred embodiment, the output of the first inverter is coupled to the input of the second inverter by the active delay element in series with the first passive delay element, and the output of the second inverter is coupled to the input of the first inverter by the second passive delay element. However, in another embodiment, the output of the second inverter may be coupled directly to the input of the first inverter. The first and second passive delay elements may be polycrystalline resistors with a value greater than or equal to 100 kilo-ohms. Further, the first and second passive delay elements may be implemented in a separate layer from the active components of the SRAM cell.

The active delay element may include a switch transistor and first and second Schottky resistors. The switch transistor may include two MOSFETs coupled in series, with their body and source tied together. The switch transistor may also have a reduced lateral bipolar gain. The first Schottky resistor may be coupled between the body and drain of the switch transistor, and the second Schottky resistor may be coupled between the body and source of the switch transistor. The resistance of the first and second Schottky resistors is preferably greater than the resistance of the first and second passive delay elements. The higher resistance first and second Schottky resistors may increase critical charge of the memory cell, and may not increase the read or write time of the memory cell because the Schottky resistors are shorted out during dynamic mode.

One benefit of the SRAM cell described above is that the SRAM cell may be SEU hardened for both heavy ions and protons. Specifically, the active delay element may act to reduce the sensitivity of the SRAM cell to heavy ion SEUs, and the first and second passive delay elements may act to reduce the sensitivity of the SRAM cell to proton SEUs and low LET heavy ion SEUs, including a double-node hit. Another benefit of the SRAM cell described above is that the SRAM cell may be protected from SEUs that occur when the SRAM cell is operating in dynamic mode. Yet another benefit of the SRAM cell described above is that the temperature performance of the SRAM cell may be improved because the passive delay elements are implemented on a different layer.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

Figure 8:
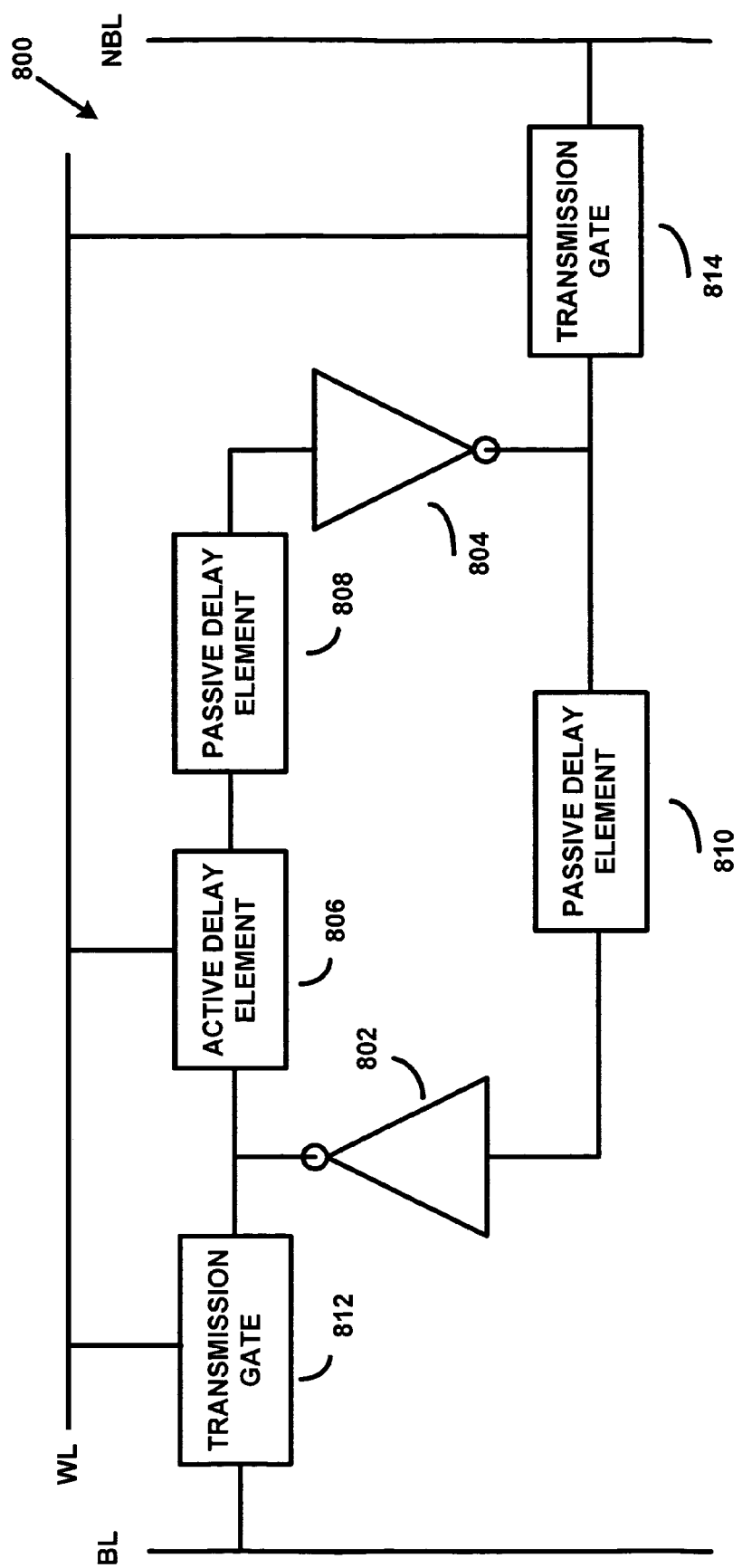
FIG. 8 is a schematic diagram of a memory cell according to an embodiment of the present invention.

A memory cell 800 according to an embodiment of the present invention is shown in FIG. 8. The memory cell 800 may include a first inverter 802, a second inverter 804, an active delay element 806, a first passive delay element 808, a first transmission gate 812, a second transmission gate 814, a bit line BL, an inverted bit line NBL, and a word line WL. In addition, the memory cell 800 may also include a second passive delay element 810.

The inverters 802 and 804 may be cross coupled. Accordingly, in the preferred embodiment, the output of the first inverter 802 may be coupled to the input of the second inverter 804 through the active delay element 806 in series with the first passive delay element 808, and the output of the second inverter 804 may be coupled to the input of the first inverter 802 through the second passive delay element 810. However, in another embodiment, the output of the second inverter 804 may be coupled directly to the input of the first inverter 802.

The first transmission gate 812 may be coupled to the output of the first inverter 802, the bit line BL, and the word line WL. Similarly, the second transmission gate 814 may be coupled to the output of the second inverter 804, the inverted bit line NBL, and the word line WL. The active delay element 806 may also be connected to the word line WL.

Figure 9:
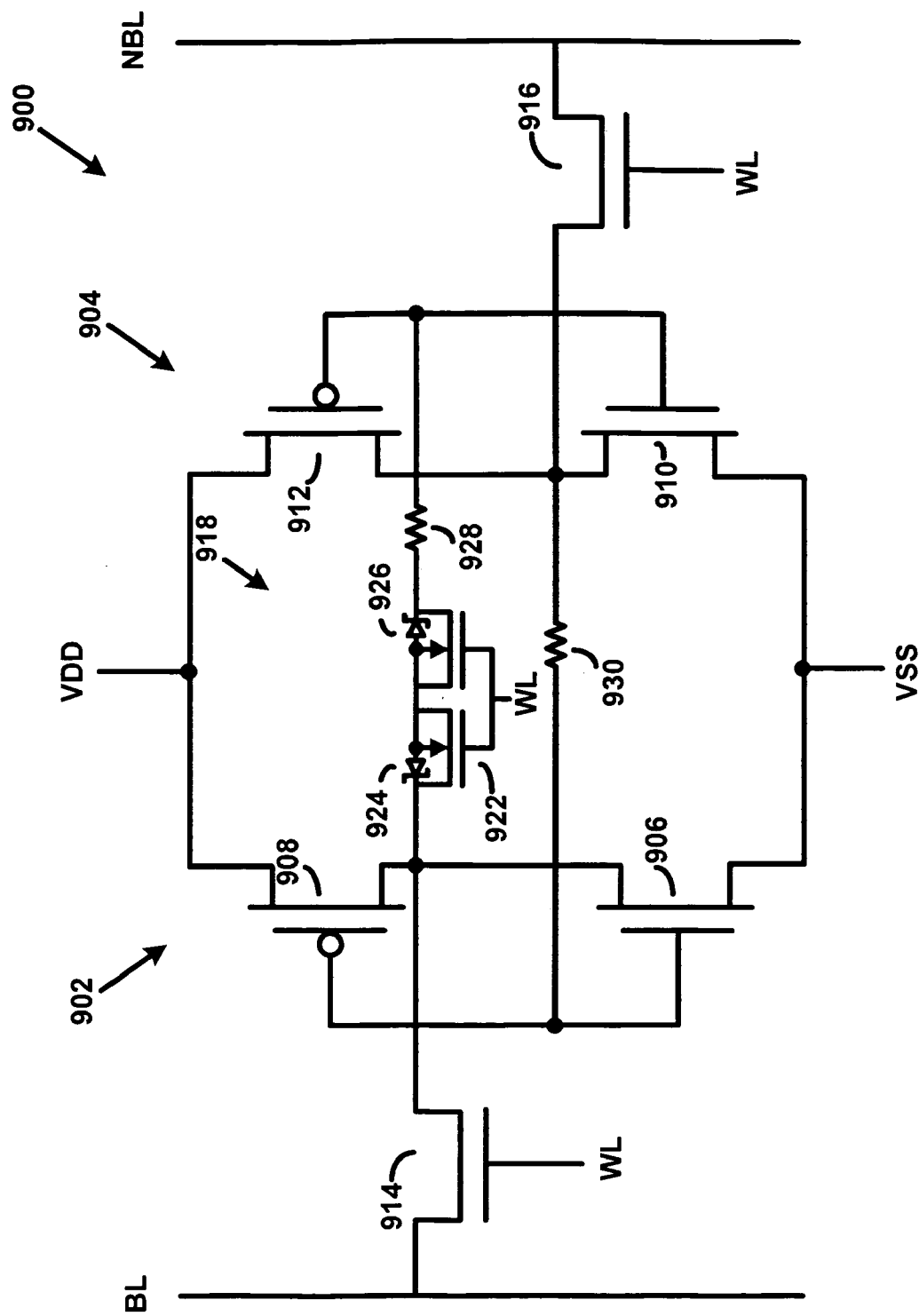
FIG. 9 is a schematic diagram of a complimentary metal-oxide semiconductor (CMOS) implementation of a memory cell according to an embodiment of the present invention.

A CMOS implementation of a memory cell 900 according to an embodiment of the present invention is shown in FIG. 9. The memory cell 900 may include a first inverter 902, a second inverter 904, an active delay element 918, a first passive delay element 928, a first transmission gate 914, a second transmission gate 916, a non-inverted bit line BL, an inverted bit line NBL, and a word line WL. In addition, the memory cell 900 may also include a second passive delay element 930.

The first inverter 902 includes MOSFETs 906 and 908, and the second inverter 904 includes MOSFETs 910 and 912. The source terminals of the MOSFETs 906 and 910 are coupled to a source VSS, and the source terminals of the MOSFETs 908 and 912 are coupled to a supply VDD. The first and second inverters 902 and 904 are cross coupled. Accordingly, in the preferred embodiment, the drain terminals of the MOSFETs 906 and 908 are coupled to the gate terminals of the MOSFETs 910 and 912 through the active delay element 918 in series with the first passive delay element 928, and the drain terminals of the MOSFETs 910 and 912 are coupled to the gate terminals of the MOSFETs 906 and 908 through the second passive delay element 930. However, in another embodiment, the drain terminals of the MOSFETs 910 and 912 may be coupled directly to the gate terminals of the MOSFETs 906 and 908. In either case, the active delay element 918 may be coupled to the word line WL, as described below.

The first transmission gate 914, also known as a pass gate, includes a MOSFET having a first source/drain contact coupled to the drain terminals of the MOSFETs 906 and 908, a second source/drain contact coupled to the bit line BL, and a gate terminal coupled to the word line WL. Similarly, the second transmission gate 916, or pass gate, includes a MOSFET having a first source/drain contact coupled to the draine terminals of the MOSFETs 910 and 912, a second source/drain contact coupled to the inverted bit line NBL, and a gate terminal coupled to the word line WL.

The active delay element 918 may include a switch transistor 922 and two Schottky resistors 924 and 926. The switch transistor 922 preferably includes two MOSFETs coupled in series, with their body and source tied together. The switch transistor 922 also preferably has a reduced lateral bipolar gain. The bipolar gain may be reduced by reducing the recombination lifetime of the switch transistor 922 through argon ion implantation. The first Schottky resistor 924 may be coupled between the body and drain of the switch transistor 922, and the second Schottky resistor 926 may be coupled between the body and source of the switch transistor 922. The resistance of the Schottky resistors 924 and 926 is preferably greater than the resistance of the passive delay elements 928 and 930. The higher resistance Schottky resistors 924 and 926 may increase critical charge of the memory cell 900, and may not increase the read or write time of the memory cell 900 because the Schottky resistors 924 and 926 are shorted out during dynamic mode, as described below.

Figure 1:
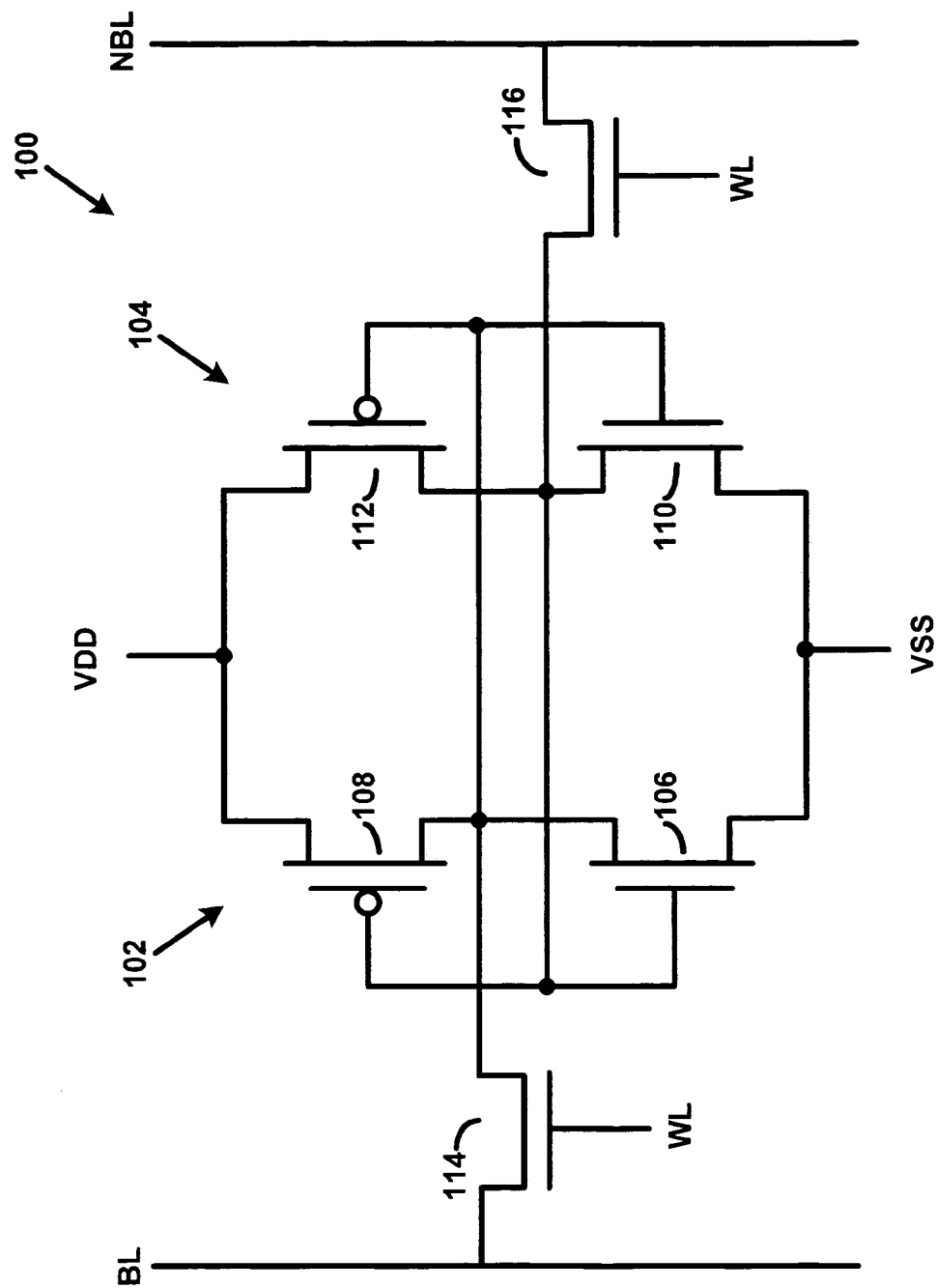
FIG. 1 is a schematic diagram of a first prior art memory cell.
Figure 2:
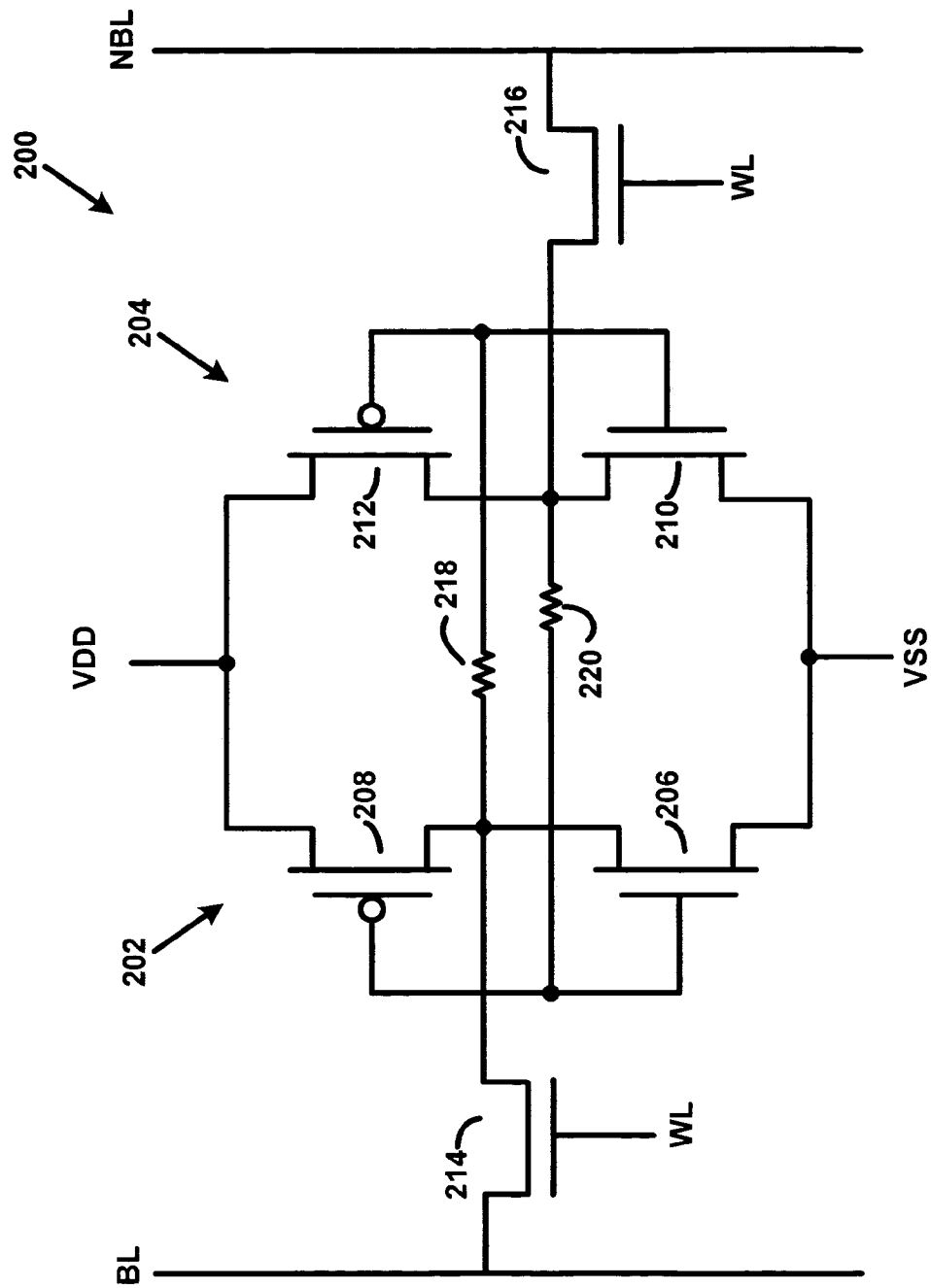
FIG. 2 is a schematic diagram of a second prior art memory cell.
Figure 3:
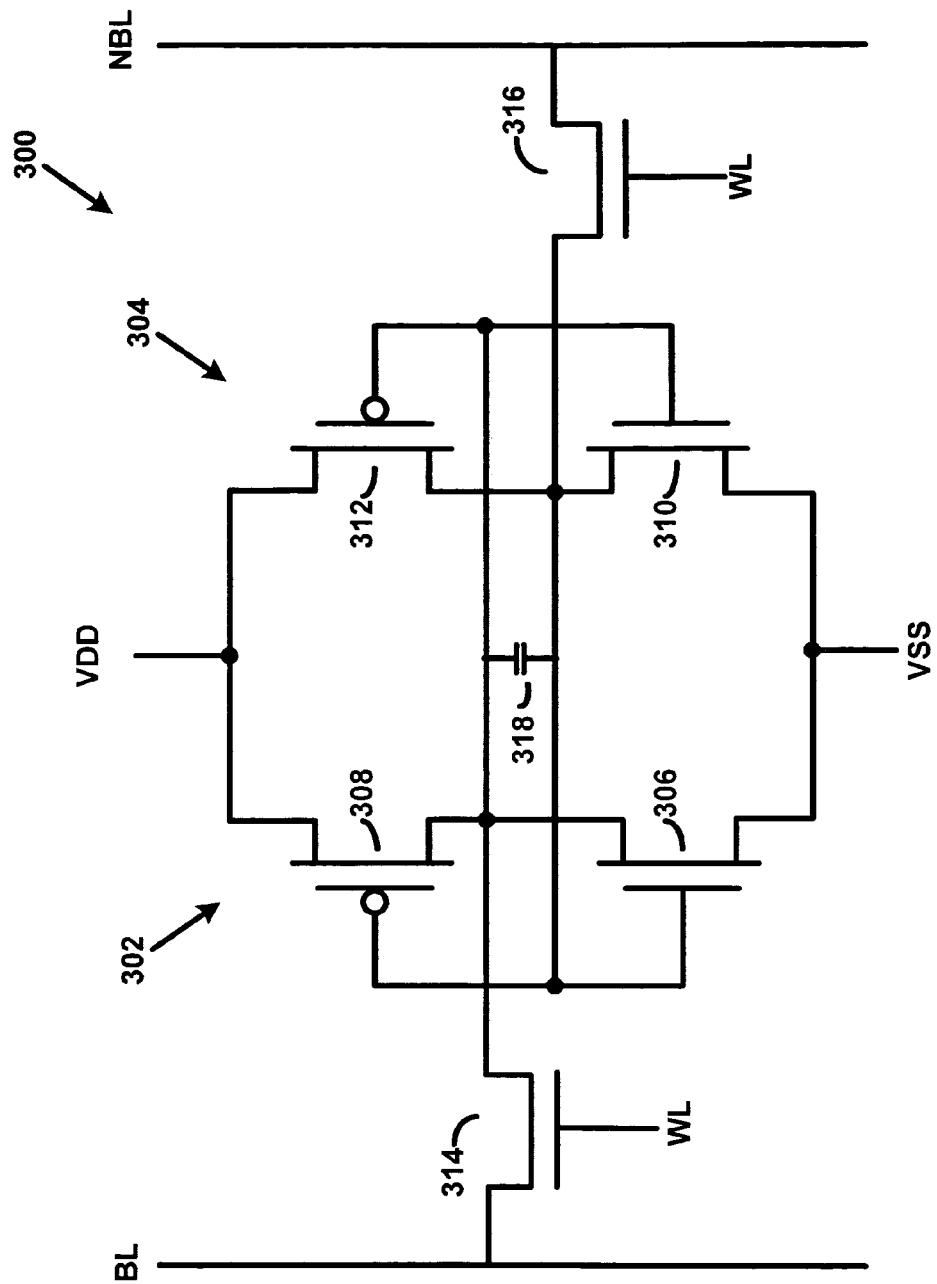
FIG. 3 is a schematic diagram of a third prior art memory cell.
Figure 4:
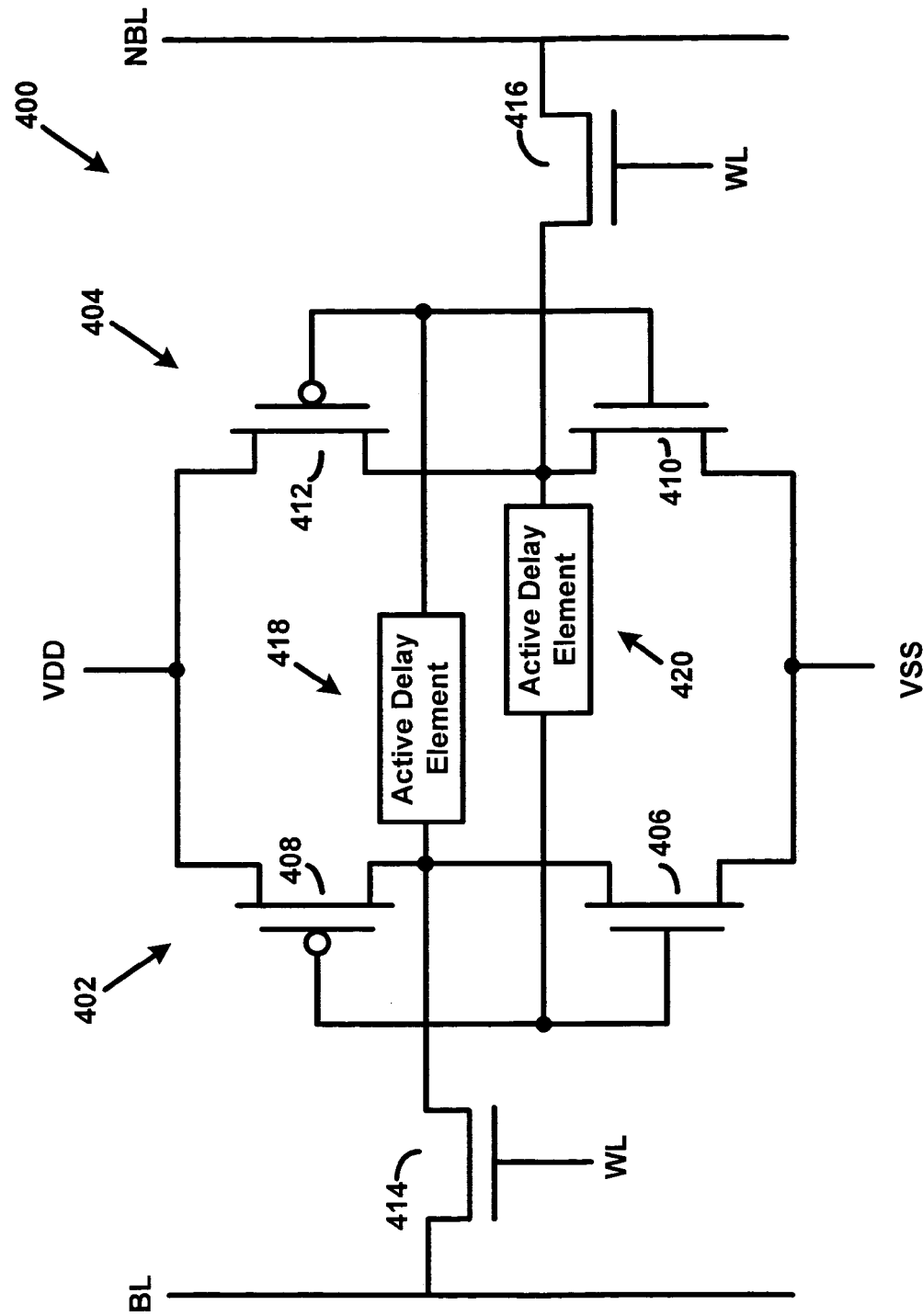
FIG. 4 is a schematic diagram of a fourth prior art memory cell.
Figure 5:
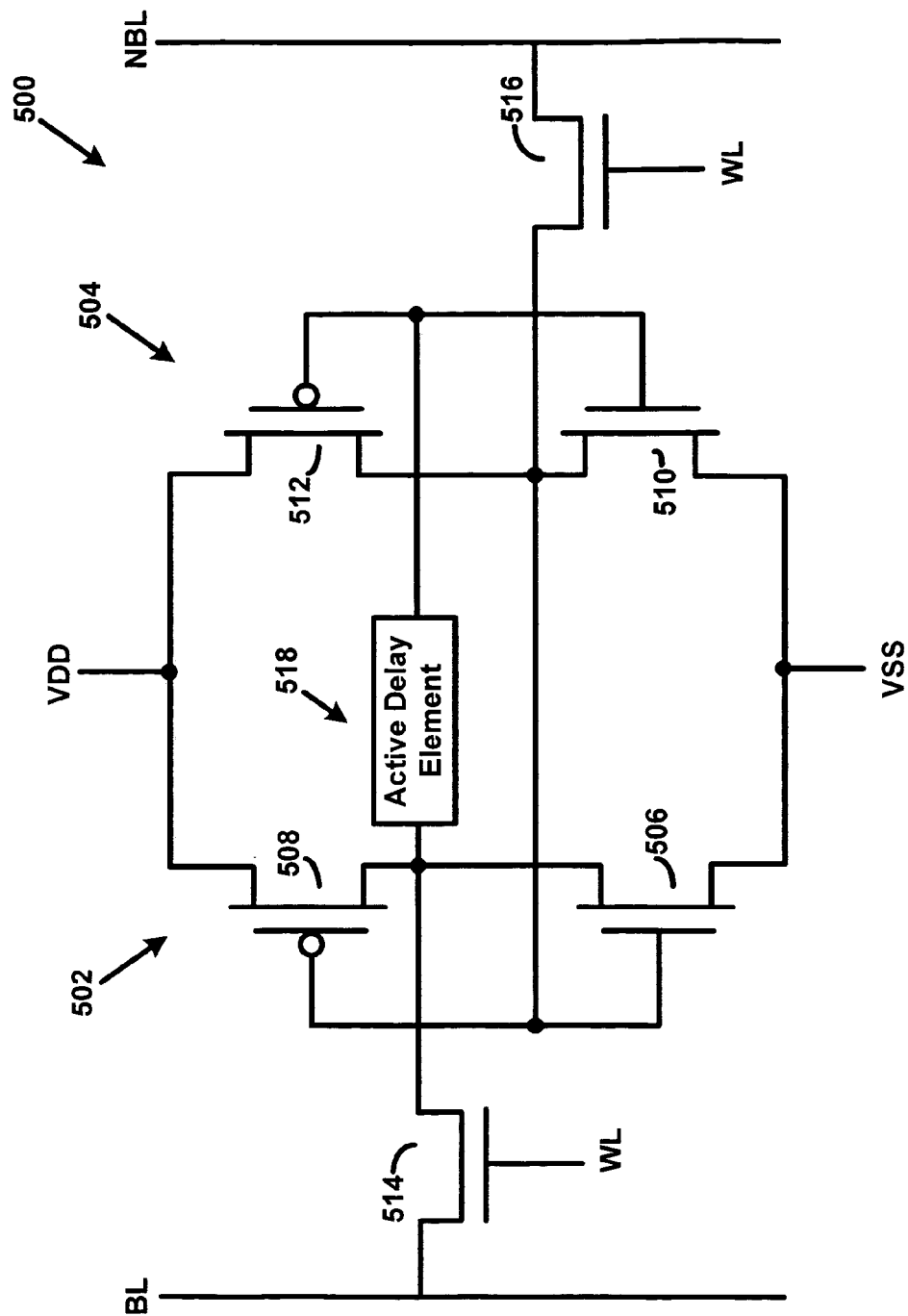
FIG. 5 is a schematic diagram of a fifth prior art memory cell.
Figure 6:
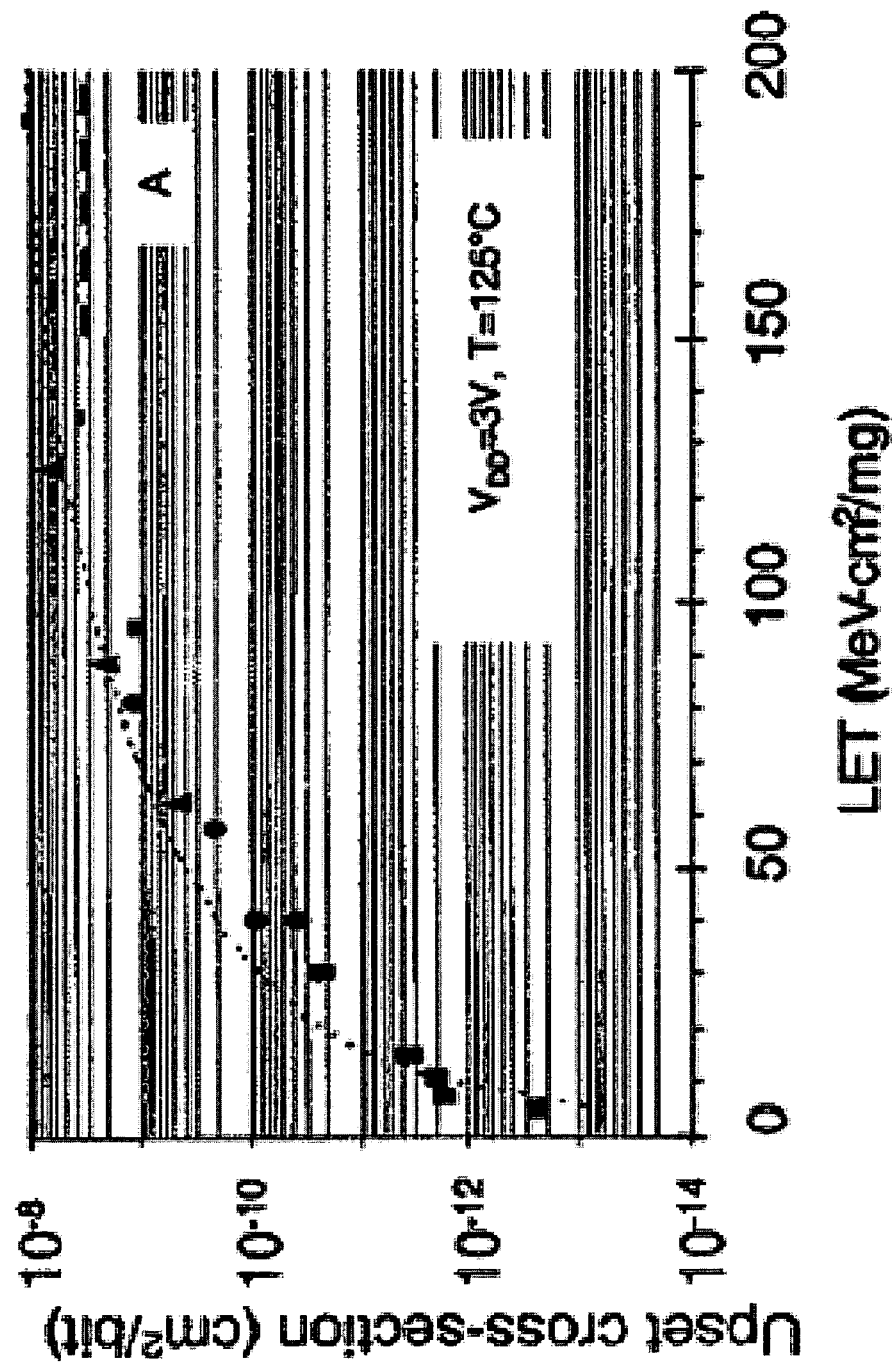
FIG. 6 is a graph of a heavy ion performance of a 4M SRAM comprising memory cells depicted in FIG. 5.
Figure 7:
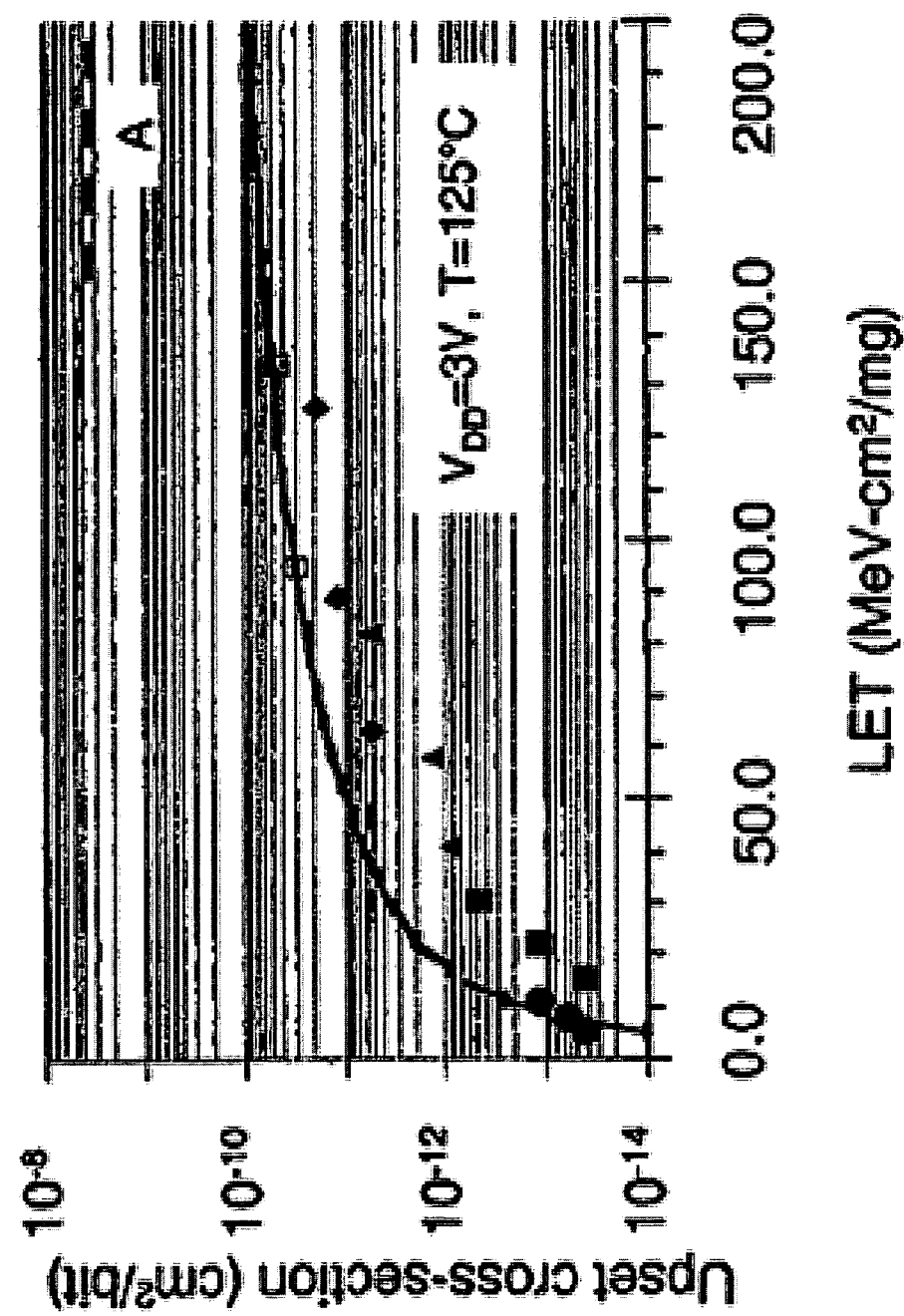
FIG. 7 is a graph of a heavy ion performance of a 4M SRAM comprising improved memory cells depicted in FIG. 5.

The gate of switch transistor 922 is preferably connected to the wordline WL. When the wordline WL is low, there may be no conductance through switch transistor 922 and state changes have to pass through Schottky resistor 924 or Schottky resistor 926. Therefore, similar to the memory cell 200 depicted in FIG. 2, the deposited charge of a heavy ion strike may be removed, and the sensitivity of memory cell 900 to heavy ion SEUs may be reduced. Alternatively, when the wordline WL is high, the switch transistor 922 may short the Schottky resistors 924 and 926, and state changes may pass through the low impedance of the switch transistor 922. Therefore, the active delay element 918 may not substantially increase the read or write time of the memory cell 900.

The passive delay elements 928 and 930 are preferably polycrystalline resistors with a resistance greater than or equal to 100 kilo-ohm. As stated previously, the first passive delay element 928 may be inserted in series with the active delay element 918 in a first feedback path of the memory cell 900, and the second passive delay element 930 may be inserted in a second feedback path of the memory cell 900. Preferably, the passive delay elements 928 and 930 are implemented in a separate layer of the memory cell 900, isolated from the active device layer by oxide.

The addition of passive delay elements 928 and 930 to memory cell 900 may provide many benefits. First, the passive delay elements 928 and 930 may increase the onset LET of memory cell 900, thus reducing the sensitivity of memory cell 900 to proton SEUs and/or double-node hits. In fact, the addition of passive delay elements 928 and 930 to memory cell 900 may reduce the proton upset limiting cross-section by multiple orders of magnitude. Further, the passive delay elements 928 and 930 may protect the memory cell 900 from SEUs that occur when the write line WL is high and the memory cell 900 is operating in dynamic mode. Further yet, the passive delay elements 928 and 930 may improve the temperature performance of the memory cell 900, because the passive delay elements 928 and 930 are implemented on a different layer.

It should be understood that the illustrated embodiments are examples only and should not be taken as limiting the scope of the present invention. It is also understood that various other signal processing components may be used. The claims should not be read as limited to the described order or elements unless stated to that effect. Therefore, all embodiments that come within the scope and spirit of the following claims and equivalents thereto are claimed as the invention.

We claim:

1. A static random access memory (SRAM) cell comprising:
   a first inverter having an input and an output;
   a second inverter having an input and an output;
   a first transmission gate coupled to the output of the first inverter;
   a second transmission gate coupled to the output of the second inverter;
   a non-inverted bit line coupled to the first transmission gate;
   an inverted bit line coupled to the second transmission gate; and
   a non-inverted word line coupled to the first and second transmission gates and to the active delay element;
   wherein the output of the first inverter is coupled to the input of the second inverter by an active delay element in series with a first passive delay element; and
   wherein the output of the second inverter is coupled to the input of the first inverter.

2. The SRAM cell of claim 1, wherein the output of the second inverter is coupled to the input of the first inverter through a second passive delay element.

3. The SRAM cell of claim 1, wherein the output of the second inverter is coupled directly to the input of the first inverter.

4. The SRAM cell of claim 2, wherein the first and second passive delay elements comprise polycrystalline resistors.

5. The SRAM cell of claim 2, wherein the first and second passive delay elements provide resistances greater than or equal to 100 kilo-ohms.

6. The SRAM cell of claim 2, wherein the first and second passive delay elements are implemented in a separate layer from the active components of the SRAM cell.

7. The SRAM cell of claim 1, wherein the active delay element comprises:
   a switch transistor having a gate, a source, a drain, and a body; and
   first and second Schottky resistors;
   wherein the first Schottky resistor is coupled between the body and drain of the switch transistor;
   wherein the second Schottky resistor is coupled between the body and source of the switch transistor; and
   wherein the gate of the switch transistor is coupled to a non-inverted word line.

8. The SRAM cell of claim 7, wherein the switch transistor comprises first and second MOSFETs each having a gate, a source, a drain, and a body, wherein the body and source of the first MOSFET are coupled together, wherein the body and source of the second MOSFET are coupled together, and wherein the source of the first MOSFET is coupled to the source of the second MOSFET.

9. The SRAM cell of claim 7, wherein the switch transistor has a reduced lateral bipolar gain.

10. The SRAM cell of claim 7, wherein the first and second Schottky resistors provide resistances greater than the resistance provided by the first passive delay element.

11. A static random access memory (SRAM) cell comprising:
   first, second, third, fourth, fifth, and sixth MOSFETs each having a gate, a source, and a drain;
   a switching seventh and eighth MOSFET each having a gate, a source, a drain, and a body;
   first and second polycrystalline resistors; and
   first and second Schottky resistors;
   wherein the gates of the third and fourth MOSFETs are coupled together;
   wherein the gates of the fifth and sixth MOSFETs are coupled together;
   wherein the sources of the third and fifth MOSFETs are coupled together;
   wherein the sources of the fourth and sixth MOSFETs are coupled together;
   wherein the drains of the third and fourth MOSFETs are coupled together;
   wherein the drains of the fifth and sixth MOSFETs are coupled together;
   wherein the body and source of the switching seventh MOSFET are coupled together;
   wherein the body and source of the switching eighth MOSFET are coupled together;
   wherein the source of the switching seventh MOSFET is coupled to the source of the switching eighth MOSFET.
   wherein the first Schottky resistor is coupled between the body and drain of the switching seventh MOSFET;
   wherein the second Schottky resistor is coupled between the body and drain of the switching eighth MOSFET;
   wherein the drains of the third and fourth MOSFETs are coupled to the gates of the fifth and sixth MOSFETs through the switching seventh and eighth MOSFETs and the first polycrystalline resistor;
   wherein the drains of the fifth and sixth MOSFETs are coupled to the gates of the third and fourth MOSFETs through the second polycrystalline resistor;
   wherein one of the source and drain of the first MOSFET is coupled to the drains of the third and fourth MOSFETs and one of the source and drain of the first MOSFET is coupled to a non-inverted bit line;
   wherein one of the source and drain of the second MOSFET is coupled to the drains of the fifth and sixth MOSFETs and one of the source and drain of the second MOSFET is coupled to an inverted bitline;
   wherein the gates of the first and second MOSFETs and the gates of the switching seventh and eighth MOSFETs are coupled to a non-inverted write line; and
   wherein the switching seventh and eighth MOSFETs each have a reduced lateral bipolar gain.

12. The SRAM cell of claim 11, wherein the first and second polycrystalline resistors are implemented in a separate layer from the active components of the SRAM cell.

13. A method of providing a static random access memory (SRAM) cell, comprising:
   providing a first inverter;
   providing a second inverter;
   providing a first transmission gate;
   providing a second transmission gate;
   providing a non-inverted bit line;
   providing an inverted bit line; and
   providing a non-inverted word line;
   coupling an output of the first inverter to an input of the second inverter through an active delay element in series with a first passive delay element;
   coupling an output of the second inverter to an input of the first inverter through a second passive delay element;
   coupling the first transmission gate to an output of the first inverter;
   coupling the second transmission gate to an output of the second inverter;
   coupling the non-inverted bit line to the first transmission gate;
   coupling the inverted bit line to the second transmission gate; and
   coupling the non-inverted word line to the first and second transmission gates and to the active delay element.

* * * * *